(12) United States Patent
Liu

(10) Patent No.: US 9,269,455 B2
(45) Date of Patent: Feb. 23, 2016

(54) SHIFT REGISTER UNIT, GATE DRIVING CIRCUIT, ARRAY SUBSTRATE AND DISPLAY APPARATUS

(71) Applicant: BOE TECHNOLOGY GROUP CO., LTD., Beijing (CN)

(72) Inventor: Yaohu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 186 days.

(21) Appl. No.: 14/064,893

(22) Filed: Oct. 28, 2013

(65) Prior Publication Data

US 2014/0119492 A1    May 1, 2014

(30) Foreign Application Priority Data

Oct. 29, 2012    (CN) .......................... 2012 1 0423296

(51) Int. Cl.
G11C 19/00    (2006.01)
G11C 19/28    (2006.01)

(52) U.S. Cl.
CPC .............. *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 7,656,194 B2* | 2/2010 | Shin ................................ 326/46 |
| 7,663,593 B2* | 2/2010 | Jinta ............................. 345/100 |
| 8,054,935 B2* | 11/2011 | Tsai ................................ 377/64 |
| 8,102,962 B2* | 1/2012 | Liu et al. ........................ 377/64 |
| 8,553,026 B2* | 10/2013 | Park ............................... 345/212 |
| 2008/0062071 A1* | 3/2008 | Jeong ............................... 345/46 |
| 2008/0186058 A1 | 8/2008 | Chen et al. |
| 2009/0237123 A1 | 9/2009 | Jinta |
| 2012/0113088 A1* | 5/2012 | Han et al. ....................... 345/212 |
| 2013/0028370 A1* | 1/2013 | Kikuchi et al. .................. 377/64 |
| 2014/0119493 A1* | 5/2014 | Yang et al. ...................... 377/64 |
| 2014/0169518 A1* | 6/2014 | Kong et al. ...................... 377/64 |
| 2014/0192039 A1* | 7/2014 | Wang et al. .................... 345/213 |
| 2014/0240209 A1* | 8/2014 | Zhang ............................. 345/92 |
| 2014/0355731 A1* | 12/2014 | Chien et al. ..................... 377/64 |

FOREIGN PATENT DOCUMENTS

CN    101540139 A    9/2009
CN    202102694 U    1/2012

OTHER PUBLICATIONS

Allowed Claims 201210423296.9.

(Continued)

*Primary Examiner* — Tuan T Lam
(74) *Attorney, Agent, or Firm* — Ladas & Parry LLP

(57) ABSTRACT

A shift register unit, a gate driving circuit, an array substrate and a display apparatus are disclosed to reduce noises generated at an output of a next stage shift register unit caused by an output of a pervious stage shift register unit. The shift register unit at each stage comprises at least a signal inputting terminal INPUT, a signal outputting terminal OUTPUT and a capacitor CAP connected with the outputting terminal OUTPUT so as to provide an output signal to the outputting terminal OUTPUT, wherein the shift register unit further comprises a switch located between the capacitor CAP and the outputting terminal OUTPUT, and the switch is in a turned-off state when the capacitor CAP is charged.

12 Claims, 4 Drawing Sheets

(56) References Cited

OTHER PUBLICATIONS

Chinese Patent Grant Notification; Issuing Date: Jul. 30, 2014; Appln. No. 201210423296.9.

First Chinese Office Action dated Mar. 3, 2014; Appln. No. 201210423296.9.

* cited by examiner

SHIFT REGISTER UNIT, GATE DRIVING CIRCUIT, ARRAY SUBSTRATE AND DISPLAY APPARATUS

TECHNICAL FIELD

The present invention relates to a field of display technique, and particularly, to a shift register, a gate driving circuit, an array substrate and a display apparatus.

BACKGROUND

A flat panel display has developed rapidly because of its ultrathin and energy saving. Most of the flat panel displays use shift registers. Currently, the shift register realized by a GOA (Gate on Array) method not only can be integrated on a gate driving Integrated Circuit (IC) but also can cut down a manufacture procedure for a display panel, therefore it saves cost. As a result, the GOA technique has been applied widely to a manufacture process for the flat panel display recently.

FIG. 1 illustrates an existing design scheme of GOA comprising a plurality of shift registers S/R(1), S/R(2), S/R(3), . . . , S/R(N) layered and connected in cascade. Each shift register S/R(n) ($1 \leq n \leq N$) outputs a scanning signal to a corresponding gate line G(n) through its own signal outputting terminal OUTPUT, and outputs the scanning signal to a resetting signal terminal RESTE of the S/R(n−1) and a signal inputting terminal INPUT of the S/R(n+1), the scanning signal performs a resetting function and a start function for the S/R(n−1) and the S/R(n+1), respectively, wherein the S/R(1) is inputted a frame start signal STV through its own signal inputting terminal, and the respective shift registers are input a reference voltage through the reference signal terminal VSS, so that an object of progressive scanning can be realized.

A schematic diagram of an inner structure of the above shift register unit S/R(n) is shown in FIG. 2. As shown in FIG. 2, the shift register consists of 12 Thin Film field effect Transistors (TFT) (labeled as M1, M2, M3, M4, M5, M6, M8, M9, M10, M11, M12 and M13 in FIG. 2, respectively) and one capacitor CAP (labeled as C1 in FIG. 2), and its corresponding control timing diagram is as illustrated in FIG. 3. For each shift register unit S/R(n), it may be in three control states as follows: (1) the inputting terminal INPUT and a clock signal CLKB are at a high level, a clock signal CLK is at a low level, and the M1, M13, M9, M8, M5, M6 and M12 are in a turned-on state and other TFTs are in a turned-off state at this time thereby the inputting terminal INPUT inputs a signal in this case and thus the outputting terminal OUTPUT outputs a low level signal since the CLK is at the low level; (2) the inputting terminal INPUT and the CLKB are at the low level, the CLK is at the high level, and the M3, M9, M5, M6 and M8 are in the turned-on state and other TFTs are in the turned-off state at this time thereby the outputting terminal OUTPUT outputs a high level signal in this case; (3) the CLKB is at the high level, the inputting terminal INPUT and the CLK are at the low level, and the M13, M12, M11, M10, M2, M4, M5 and M9 are in the turned-on state and other TFTs are in the turned-off stage at this time thereby a resetting operation is performed for a shift register unit at a previous stage in this case.

It can be seen from the description above that since the shift register unit at the Nth stage uses an output signal of the shift register unit at the (N−1)th stage as an input signal, the outputting terminal OUTPUT of the shift register unit at the Nth stage will output noise due to the existence of the capacitor C1 when the shift register unit at the Nth stage is in the first control state described above.

SUMMARY

To address the technical problems existing in the prior art, there are provided in embodiments of the present invention a shift register unit, a gate driving circuit, an array substrate and a display apparatus to reduce noises generated at an output of a next stage shift register unit at caused by an output of a pervious stage shift register unit.

A shift register unit in accordance with the embodiments of the present invention, each stage of the shift register unit comprises at least a signal inputting terminal INPUT, a signal outputting terminal OUTPUT and a capacitor CAP connected with the outputting terminal OUTPUT to provide an output signal to the outputting terminal OUTPUT. The shift register unit further comprises a switch located between the capacitor CAP and the outputting terminal OUTPUT, and the switch is in a turned-off state when the capacitor CAP is charged.

A gate driving circuit provided in the embodiments of the present invention comprises the shift register unit described above.

An array substrate provided in the embodiments of the present invention comprises the gate driving circuit described above.

A display apparatus provided in the embodiments of the present invention comprises the array substrate described above.

In the shift register unit, the gate driving circuit, the array substrate and the display apparatus according to the embodiments of the present invention, by adding a switch between the capacitor CAP and the outputting terminal OUTPUT, which is in the turned-off state when the inputting terminal INPUT charges the capacitor CAP, the outputting terminal OUTPUT is avoided to couple with the capacitor CAP and output the noises. Thus, when a plurality of the shift register units are layered and connected in cascade to construct a shift register, the noises generated at the output of the next stage shift register unit caused by the output of the pervious stage shift register unit can be reduced.

Other features and advantages of the present invention will be explained in following description, and will partly become apparent from the detailed description given hereinafter or will be know by practice of the present invention. Features and other advantages of the present invention may be achieved and acquired by structures recited specially in the disclosed specification, claims and the drawings.

DETAILED DESCRIPTION

In order to reduce noises generated at the output of the next stage shift register unit caused by the output of the pervious stage shift register unit, there are provided in the embodiments of the present invention a shift register unit, a gate driving circuit, an array substrate and a display apparatus.

Exemplary embodiments of the present invention will be described in conjunction with the accompanying drawings. It should be understood that the exemplary embodiments described herein are only used to illustrate and explain the present invention, but not to limit the present invention, and the embodiments of the present invention and features in the embodiments may be combined with each other in a case of no conflicts.

Figure 1:
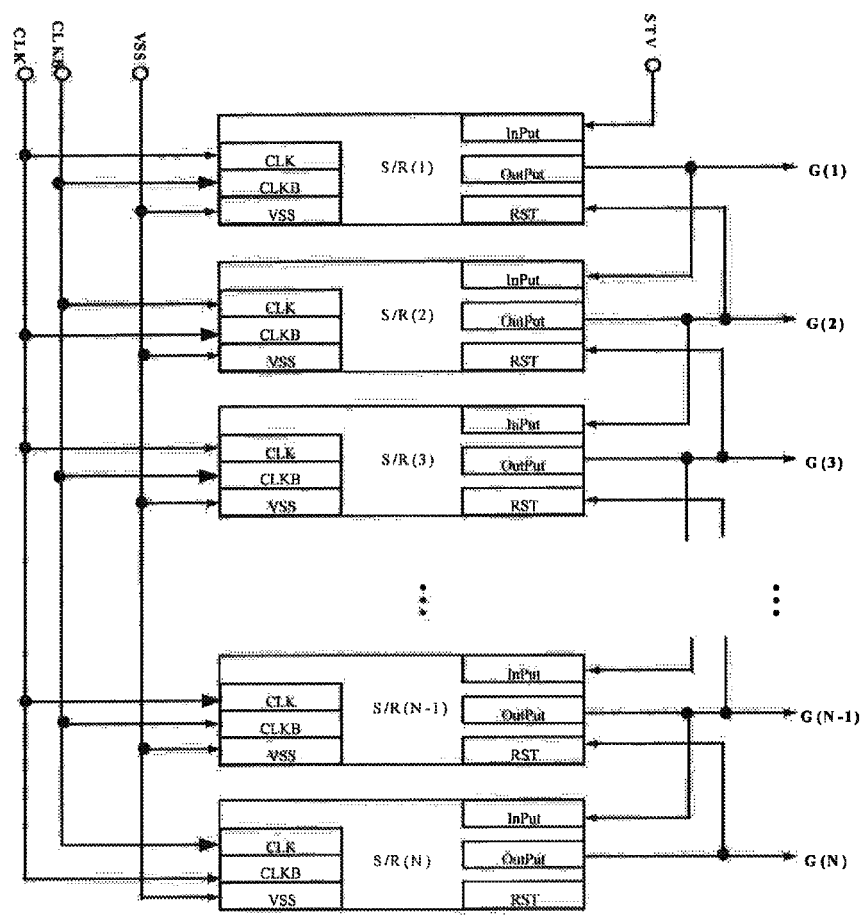
FIG. 1 is a schematic diagram illustrating a connection structure of a shift register in the prior art.
Figure 2:
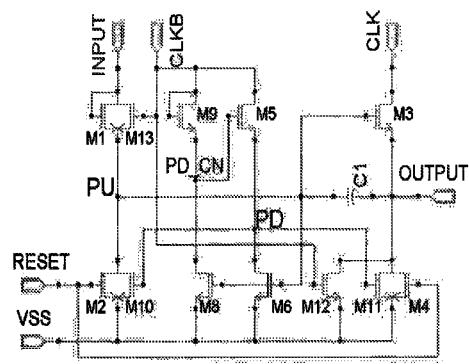
FIG. 2 is a schematic diagram illustrating a connection structure for an inner circuit of the shift register in the prior art.
Figure 4:
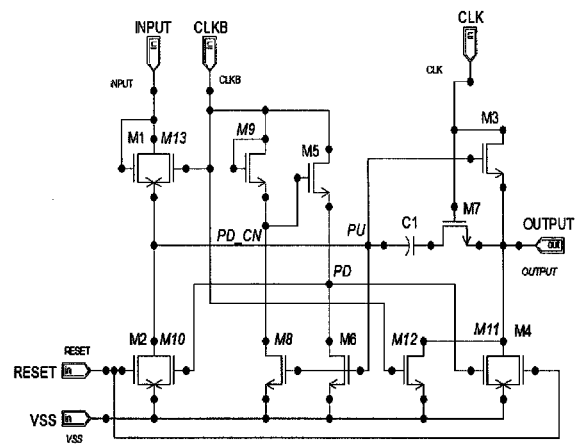
FIG. 4 is a schematic diagram illustrating a first connection structure for an inner circuit of a shift register according to the embodiments of the present invention.

The embodiments of the present invention provide a shift register unit, and FIG. 4 shows a schematic diagram of a circuit structure of a shift register unit according to the embodiments of the present invention. As shown in FIG. 4, a switch is added between a capacitor (CAP, identified as C1 in FIG. 2) and a signal outputting terminal OUTPUT on a basis of FIG. 2 in the shift register unit according to the embodiments of the present invention. Optionally, the switch may be but not limited to a TFT. The switch is in a turned-off state when a signal inputting terminal INPUT charges the CAP, so that the outputting terminal may be avoided to couple with the CAP and output noises. A connection manner is as follows when the switch is the TFT (the newly added TFT is identified as M7 in FIG. 4): a source of the TFT is connected with the CAP, a drain thereof is connected with the outputting terminal OUTPUT, and a gate thereof is connected with a clock signal CLK. In a specific implementation, the shift register unit may further comprise a resetting signal terminal RESET, a reference signal terminal VSS, a pulling-up node PU and a capacitor CAP located between the pulling-up node PU and the outputting terminal OUTPUT, wherein, when an input signal received by the inputting terminal INPUT is at a high level, CLKB is at the high level, CLK is at a low level, while the pulling-up node PU and the capacitor CAP are in a charging state, and at this time an output signal at the outputting terminal OUTPUT is at the low level;

when the input signal received by the inputting terminal INPUT is at the low level, CLKB is at the low level and CLK is at the high level, a potential at the node PU is pulled high, so that the output signal at the outputting terminal OUTPUT is at the high level;

when the input signal received by the inputting terminal INPUT is at the low level, CLKB is at the high level and CLK is at the low level, a potential at the node PU is pulled low, so that the output signal at the outputting terminal OUTPUT is at the low level;

the resetting terminal RESET is connected with an signal outputting terminal of a next stage shift register with respect to the current stage shift register;

the reference signal terminal VSS is used for inputting a low level signal in order to provide a reference voltage.

The shift register unit illustrated in FIG. 4 comprises a first thin film transistor M1, a second thin film transistor M2, a third thin film transistor M3, a fourth thin film transistor M4, a fifth thin film transistor M5, a sixth thin film transistor M6, a seventh thin film transistor M7, an eighth thin film transistor M8, a ninth thin film transistor M9, a tenth thin film transistor M10, an eleventh thin film transistor M11, a twelfth thin film transistor M12, a thirteenth thin film transistor M13, a capacitor C1, a pulling-up node PU, a pulling-down node PD, and a pulling-down connection node PD_CN, wherein:

a gate and a drain of M1 are connected with the signal inputting terminal INPUT, and a source thereof is connected with the pulling-up node PU;

a gate of M2 is connected with the resetting signal terminal RESET, a drain thereof is connected with the pulling-up node PU, and a source thereof is connected with the reference signal terminal VSS;

a gate of M3 is connected with the pulling-up node PU, a drain thereof is connected with the clock signal CLK, and a source thereof is connected with the signal outputting terminal OUTPUT;

a gate of M4 is connected with the resetting signal terminal RESET, a drain thereof is connected with the signal outputting terminal OUTPUT, and a source thereof is connected with the reference signal terminal VSS;

a gate of M5 is connected with the pulling-down connection node PD_CN, a drain thereof is connected with the clock signal CLKB, and a source thereof is connected with the pulling-down node PD;

a gate of M6 is connected with the pulling-up node PU, a drain thereof is connected with the pulling-down node PD, and a source thereof is connected with the reference signal terminal VSS;

a gate of M7 is connected with the clock signal CLK, a drain thereof is connected with the signal outputting terminal OUTPUT, and a source thereof is connected with the capacitor C1;

a gate of M8 is connected with the pulling-up node PU, a drain thereof is connected with the pulling-down connection node PD_CN, and a source thereof is connected with the reference signal terminal VSS;

a gate and a drain of M9 are connected with the clock signal CLKB, and a source thereof is connected with the pulling-down connection node PD_CN;

a gate of M10 is connected with the pulling-down node PD, a drain thereof is connected with the pulling-up node PU, and the source thereof is connected with the reference signal terminal VSS;

a gate of M11 is connected with the pulling-down node PD, a drain thereof is connected with the signal outputting terminal OUTPUT, and a source thereof is connected with the reference signal terminal VSS;

a gate of M12 is connected with the clock signal CLKB, a drain thereof is connected with the signal outputting terminal OUTPUT, a source thereof is connected with the reference signal terminal VSS;

a gate of M13 is connected with the clock signal CLKB, a drain thereof is connected with the signal inputting terminal INPUT, and the source thereof is connected with the pulling-up node PU.

Figure 3:
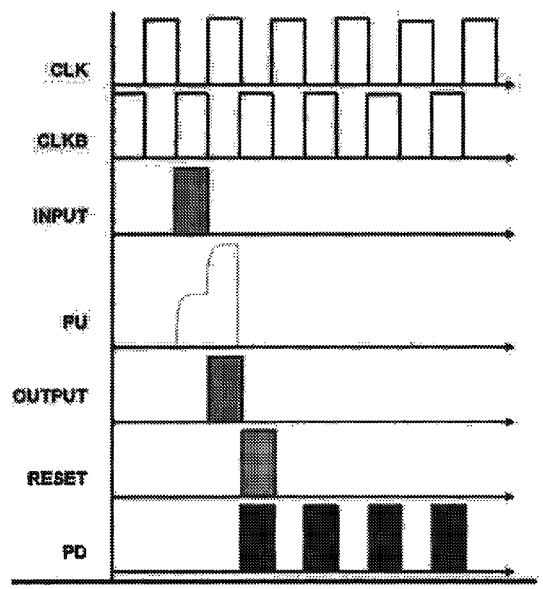
FIG. 3 is a schematic diagram illustrating a control timing of the shift register in the prior art.

An operating principle of the embodiments of the present invention will be described thereafter in connection with the schematic diagram of the control timing as shown in FIG. 3. When the inputting terminal INPUT and CLKB are at the high level, CLK is at the low level, the inputting terminal INPUT and CLKB charge the C1 up to VGH (a starting voltage) through the M1 and M13, at the same time, the M12 is turned on and pulls down an output at the outputting terminal OUTPUT, and M6, M8, M9 are turned on to pull down the nodes PD_CN and PD to VSS (the reference voltage), so that the M10, M11 are in the turned-off state; M7 is in the turned-off state at this time since CLK is at the low level such that the outputting terminal OUTPUT is avoided to couple with the C1 and output the noises, and all of other TFTs are in the turned-off state; when the inputting terminal INPUT and CLKB are at the low level, CLK is at the high level, M1, M13, M9 and M5 are in the turned-off state, and at this time, M3, M7 are turned on, CLK is outputted to the outputting terminal OUTPUT via M3 and coupled to the node PU, thereby the node PU is pulled up and other TFTs are in the turned-off state; when the inputting terminal INPUT and CLK are at the low level, CLKB is at the high level, M2, M4 are turned on to pull down the node PU and the outputting terminal OUTPUT, M9, M5 are turned on to pull up the node PD, M11 and M10 are turned on to continually pull down the node PU and the outputting terminal OUTPUT, further, the M12 is turned on at this time to pull down the outputting terminal OUTPUT also, and other TFTs are in the turned-off state, such that the resetting operation of the previous stage shift register unit is implemented.

In the embodiments of the present invention, there is further provided a gate driving circuit comprising the shift register unit described above.

In a specific implementation, the gate driving circuit may be configured in an array substrate.

In the embodiments of the present invention, there is further provided a display apparatus comprising any array substrate as described above. The display apparatus may be a liquid crystal panel, a piece of electronic paper, an Organic Light-Emitting Diode (OLED) panel, a mobile phone, a tablet computer, a television, a display, a notebook computer, a digital photo frame, a navigation machine and any other product or means having a displaying function.

The above-described liquid crystal panel may comprise a color film substrate, an array substrate and a liquid crystal disposed between the color film substrate and the array substrate, and the array substrate in the liquid crystal display panel comprises the shift register according to the embodiments of the present invention.

Figure 5:
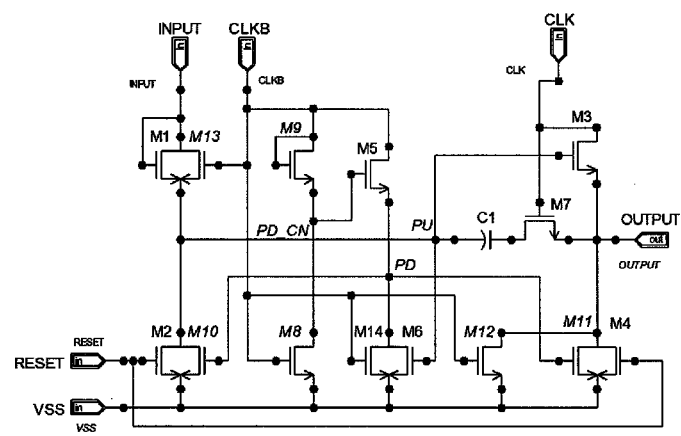
FIG. 5 is a schematic diagram illustrating a second connection structure for an inner circuit of a shift register according to the embodiments of the present invention.
Figure 6:
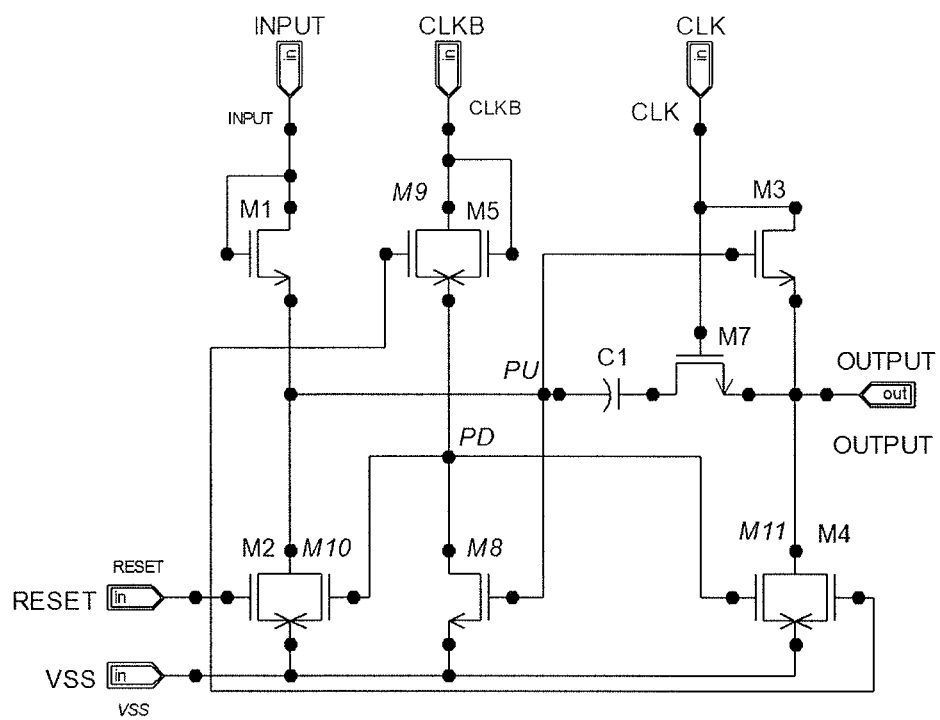
FIG. 6 is a schematic diagram illustrating a third connection structure for an inner circuit of a shift register according to the embodiments of the present invention.

It should be noted that, in the embodiments of the present invention, the circuit structure of the shift register unit is not limited thereto. FIG. 5 and FIG. 6 illustrate the schematic diagram of the circuit structures of another two shift register units according to the embodiments of the present invention, which differ from the structure in FIG. 4 only in the circuit structure of the original shift register unit. Also, a switch (identified as M7 both in FIG. 5 and FIG. 6) is added between a capacitor C1 and an outputting terminal. Taking the newly added switch being a TFT as an example, the connection structure of this switch is the same as that of the shift register unit illustrated in FIG. 4, that is, a source of the TFT is connected with a capacitor CAP, a drain thereof is connected with an outputting terminal OUTPUT, and a gate thereof is connected with a clock signal CLK. Since the principle for reducing the output noise in the shift register units shown in FIG. 5 and FIG. 6 are the same as that of the shift register unit as illustrated in FIG. 4, their specific operations may be referred to the description of FIG. 4 and the details will not be repeated herein.

The shift register unit illustrated in FIG. 5 comprises a first thin film transistor M1, a second thin film transistor M2, a third thin film transistor M3, a fourth thin film transistor M4, a fifth thin film transistor M5, a sixth thin film transistor M6, a seventh thin film transistor M7, an eighth thin film transistor M8, a ninth thin film transistor M9, a tenth thin film transistor M10, an eleventh thin film transistor M11, a twelfth thin film transistor M12, a thirteenth thin film transistor M13, a fourteenth thin film transistor M14, a capacitor C1, a pulling-up node PU, a pulling-down node PD, and a pulling-down connection node PD_CN, wherein:

a gate and a drain of M1 are connected with the signal inputting terminal INPUT, and a source thereof is connected with the pulling-up node PU;

a gate of M2 is connected with the resetting signal terminal RESET, a drain thereof is connected with the pulling-up node PU, and a source thereof is connected with the reference signal terminal VSS;

a gate of M3 is connected with the pulling-up node PU, a drain thereof is connected with the clock signal CLK, and a source thereof is connected with the signal outputting terminal OUTPUT;

a gate of M4 is connected with the resetting signal terminal RESET, a drain thereof is connected with the signal outputting terminal OUTPUT, and a source thereof is connected with the reference signal terminal VSS;

a gate of M5 is connected with the pulling-down connection node PD_CN, a drain thereof is connected with the clock signal CLKB, and a source thereof is connected with the pulling-down node PD;

a gate of M6 is connected with the pulling-up node PU, a drain thereof is connected with the pulling-down node PD, and a source thereof is connected with the reference signal terminal VSS;

a gate of M7 is connected with the clock signal CLK, a drain thereof is connected with the signal outputting terminal OUTPUT, and a source thereof is connected with the capacitor C1;

a gate of M8 is connected with the clock signal CLKB, a drain thereof is connected with the pulling-down connection node PD_CN, and a source thereof is connected with the reference signal terminal VSS;

a gate and a drain of M9 are connected with the clock signal CLKB, and a source thereof is connected with the pulling-down connection node PD_CN;

a gate of M10 is connected with the pulling-down node PD, a drain thereof is connected with the pulling-up node PU, and the source thereof is connected with the reference signal terminal VSS;

a gate of M11 is connected with the pulling-down node PD, a drain thereof is connected with the signal outputting terminal OUTPUT, and a source thereof is connected with the reference signal terminal VSS;

a gate of M12 is connected with the clock signal CLKB, a drain thereof is connected with the signal outputting terminal OUTPUT, a source thereof is connected with the reference signal terminal VSS;

a gate of M13 is connected with the clock signal CLKB, a drain thereof is connected with the signal inputting terminal INPUT, and the source thereof is connected with the pulling-up node PU;

a gate of M14 is connected with the clock signal CLKB, a drain thereof is connected with the pulling-down node PD, and a source thereof is connected with the reference signal terminal VSS.

The shift register unit illustrated in FIG. 6 comprises a first thin film transistor M1, a second thin film transistor M2, a third thin film transistor M3, a fourth thin film transistor M4, a fifth thin film transistor M5, a seventh thin film transistor M7, an eighth thin film transistor M8, a ninth thin film transistor M9, a tenth thin film transistor M10, an eleventh thin film transistor M11, a capacitor C1, a pulling-up node PU, and a pulling-down node PD, wherein:

a gate and a drain of M1 are connected with the signal inputting terminal INPUT, and a source thereof is connected with the pulling-up node PU;

a gate of M2 is connected with the resetting signal terminal RESET, a drain thereof is connected with the pulling-up node PU, and a source thereof is connected with the reference signal terminal VSS;

a gate of M3 is connected with the pulling-up node PU, a drain thereof is connected with the clock signal CLK, and a source thereof is connected with the signal outputting terminal OUTPUT;

a gate of M4 is connected with the resetting signal terminal RESET, a drain thereof is connected with the signal outputting terminal OUTPUT, and a source thereof is connected with the reference signal terminal VSS;

a gate and a drain of M5 are connected with the clock signal CLKB, and a source thereof is connected with the pulling-down node PD;

a gate of M7 is connected with the clock signal CLK, a drain thereof is connected with the signal outputting terminal OUTPUT, and a source thereof is connected with the capacitor C1;

a gate of M8 is connected with the pulling-up node PU, a drain thereof is connected with the pulling-down node PD, and a source thereof is connected with the reference signal terminal VSS;

a gate of M9 is connected with the resetting signal terminal RESET, a drain thereof is connected with the clock signal CLKB, and a source thereof is connected with the pulling-down node PD;

a gate of M10 is connected with the pulling-down node PD, a drain thereof is connected with the pulling-up node PU, and the source thereof is connected with the reference signal terminal VSS;

a gate of M11 is connected with the pulling-down node PD, a drain thereof is connected with the signal outputting terminal OUTPUT, and a source thereof is connected with the reference signal terminal VSS.

It is obvious that those skilled in the art can make various alternations and modifications to the present invention without departing from the spirit and scope of the present invention. Therefore, these alternations and modifications are intended to be included in the present invention if they fall into the scope of the claims and their equivalent techniques.

What is claimed is:

1. A shift register unit, each stage thereof comprising at least: a signal inputting terminal INPUT, a signal outputting terminal OUTPUT and a capacitor CAP connected with the outputting terminal OUTPUT to provide an output signal to the outputting terminal OUTPUT, wherein the shift register unit further comprises a thin film transistor TFT located between the capacitor CAP and the outputting terminal OUTPUT, a source of the TFT is connected with the capacitor CAP, a drain thereof is connected with the outputting terminal OUTPUT, and a gate thereof is connected with a clock signal CLK, and the TFT is in a turned-off state when the capacitor CAP is charged.

2. The shift register unit of claim 1, further comprising a resetting signal terminal RESET, a reference signal terminal VSS and a pulling-up node PU, the capacitor CAP being located between the pulling-up node PU and the terminal OUTPUT, wherein, when an input signal received by the inputting terminal INPUT is at a high level, a first clock signal CLKB is at the high level, the clock signal CLK is at a low level, while the pulling-up node PU and the capacitor CAP are in a charging state, an output signal at the outputting terminal OUTPUT is at the low level;

when the input signal received by the inputting terminal INPUT is at the low level, CLKB is at the low level and CLK is at the high level, a potential at the node PU is pulled high, and thus the output signal at the outputting terminal OUTPUT is at the high level;

when the input signal received by the inputting terminal INPUT is at the low level, CLKB is at the high level and CLK is at the low level, a potential at the node PU is pulled low, and thus the output signal at the outputting terminal OUTPUT is at the low level;

the resetting terminal RESET is connected with a signal outputting terminal of a next stage shift register with respect to the current stage shift register;

the reference signal terminal VSS is used for inputting a low level signal to provide a reference voltage.

3. The shift register unit of claim 2, comprising:

a first thin film transistor, a gate and a drain thereof are connected with the signal inputting terminal INPUT, and a source thereof is connected with the pulling-up node PU;

a second thin film transistor, a gate thereof is connected with the resetting signal terminal RESET, a drain thereof is connected with the pulling-up node PU, and a source thereof is connected with the reference signal terminal VSS;

a third thin film transistor, a gate thereof is connected with the pulling-up node PU, a drain thereof is connected with the clock signal CLK, and a source thereof is connected with the signal outputting terminal OUTPUT;

a fourth thin film transistor, a gate thereof is connected with the resetting signal terminal RESET, a drain thereof is connected with the signal outputting terminal OUTPUT, and a source thereof is connected with the reference signal terminal VSS;

a fifth thin film transistor, a gate thereof is connected with a pulling-down connection node PD_CN, a drain thereof is connected with the first clock signal CLKB, and a source thereof is connected with a pulling-down node PD;

a sixth thin film transistor, a gate thereof is connected with the pulling-up node PU, a drain thereof is connected with the pulling-down node PD, and a source thereof is connected with the reference signal terminal VSS;

an eighth thin film transistor, a gate thereof is connected with the pulling-up node PU, a drain thereof is connected with the pulling-down connection node PD_CN, and a source thereof is connected with the reference signal terminal VSS;

a ninth thin film transistor, a gate and a drain thereof are connected with the first clock signal CLKB, and a source thereof is connected with the pulling-down connection node PD_CN;

a tenth thin film transistor, a gate thereof is connected with the pulling-down node PD, a drain thereof is connected with the pulling-up node PU, and the source thereof is connected with the reference signal terminal VSS;

an eleventh thin film transistor, a gate thereof is connected with the pulling-down node PD, a drain thereof is connected with the signal outputting terminal OUTPUT, and a source thereof is connected with the reference signal terminal VSS;

a twelfth thin film transistor, a gate thereof is connected with the first clock signal CLKB, a drain thereof is connected with the signal outputting terminal OUTPUT, a source thereof is connected with the reference signal terminal VSS;

a thirteenth thin film transistor, a gate thereof is connected with the first clock signal CLKB, a drain thereof is connected with the signal inputting terminal INPUT, and the source thereof is connected with the pulling-up node PU.

4. The shift register unit of claim 2, comprising:
a first thin film transistor, a gate and a drain thereof are connected with the signal inputting terminal INPUT, and a source thereof is connected with the pulling-up node PU;
a second thin film transistor, a gate thereof is connected with the resetting signal terminal RESET, a drain thereof is connected with the pulling-up node PU, and a source thereof is connected with the reference signal terminal VSS;
a third thin film transistor, a gate thereof is connected with the pulling-up node PU, a drain thereof is connected with the clock signal CLK, and a source thereof is connected with the signal outputting terminal OUTPUT;
a fourth thin film transistor, a gate thereof is connected with the resetting signal terminal RESET, a drain thereof is connected with the signal outputting terminal OUTPUT, and a source thereof is connected with the reference signal terminal VSS;
a fifth thin film transistor, a gate thereof is connected with the pulling-down connection node PD_CN, a drain thereof is connected with the first clock signal CLKB, and a source thereof is connected with a pulling-down node PD;
a sixth thin film transistor, a gate thereof is connected with the pulling-up node PU, a drain thereof is connected with the pulling-down node PD, and a source thereof is connected with the reference signal terminal VSS;
an eighth thin film transistor, a gate thereof is connected with the first clock signal CLKB, a drain thereof is connected with the pulling-down connection node PD_CN, and a source thereof is connected with the reference signal terminal VSS;
a ninth thin film transistor, a gate and a drain thereof are connected with the first clock signal CLKB, and a source thereof is connected with the pulling-down connection node PD_CN;
a tenth thin film transistor, a gate thereof is connected with the pulling-down node PD, a drain thereof is connected with the pulling-up node PU, and the source thereof is connected with the reference signal terminal VSS;
an eleventh thin film transistor, a gate thereof is connected with the pulling-down node PD, a drain thereof is connected with the signal outputting terminal OUTPUT, and a source thereof is connected with the reference signal terminal VSS;
a twelfth thin film transistor, a gate thereof is connected with the first clock signal CLKB, a drain thereof is connected with the signal outputting terminal OUTPUT, a source thereof is connected with the reference signal terminal VSS;
a thirteenth thin film transistor, a gate thereof is connected with the first clock signal CLKB, a drain thereof is connected with the signal inputting terminal INPUT, and the source thereof is connected with the pulling-up node PU;
a fourteenth thin film transistor, a gate thereof is connected with the first clock signal CLKB, a drain thereof is connected with the pulling-down node PD, and a source thereof is connected with the reference signal terminal VSS.

5. The shift register unit of claim 2, further comprising:
a first thin film transistor, a gate and a drain thereof are connected with the signal inputting terminal INPUT, and a source thereof is connected with the puffing-up node PU;
a second thin film transistor, a gate thereof is connected with the resetting signal terminal RESET, a drain thereof is connected with the pulling-up node PU, and a source thereof is connected with the reference signal terminal VSS;
a third thin film transistor, a gate thereof is connected with the puffing-up node PU, a drain thereof is connected with the clock signal CLK, and a source thereof is connected with the signal outputting terminal OUTPUT;
a fourth thin film transistor, a gate thereof is connected with the resetting signal terminal RESET, a drain thereof is connected with the signal outputting terminal OUTPUT, and a source thereof is connected with the reference signal terminal VSS;
a fifth thin film transistor, a gate and a drain thereof are connected with the first clock signal CLKB, and a source thereof is connected with a pulling-down node PD;
an eighth thin film transistor, a gate thereof is connected with the pulling-up node PU, a drain thereof is connected with the pulling-down node PD, and a source thereof is connected with the reference signal terminal VSS;
a ninth thin film transistor, a gate thereof is connected with the resetting signal terminal RESET, a drain thereof is connected with the first clock signal CLKB, and a source thereof is connected with the pulling-down node PD;
a tenth thin film transistor, a gate thereof is connected with the pulling-down node PD, a drain thereof is connected with the pulling-up node PU, and the source thereof is connected with the reference signal terminal VSS;
an eleventh thin film transistor, a gate thereof is connected with the pulling-down node PD, a drain thereof is connected with the signal outputting terminal OUTPUT, and a source thereof is connected with the reference signal terminal VSS.

6. A gate driving circuit, comprising shift register units, each stage thereof comprising at least: a signal inputting terminal INPUT, a signal outputting terminal OUTPUT and a capacitor CAP connected with the outputting terminal OUTPUT to provide an output signal to the outputting terminal OUTPUT, wherein the shift register unit further comprises a thin film transistor TFT located between the capacitor CAP and the outputting terminal OUTPUT, a source of the TFT is connected with the capacitor CAP, a drain thereof is connected with the outputting terminal OUTPUT, and a gate thereof is connected with a clock signal CLK, and the TFT is in a turned-off state when the capacitor CAP is charged.

7. The gate driving circuit of claim 6, further comprising a resetting signal terminal RESET, a reference signal terminal VSS and a pulling-up node PU, the capacitor CAP being located between the pulling-up node PU and the terminal OUTPUT, wherein,
when an input signal received by the inputting terminal INPUT is at a high level, a first clock signal CLKB is at the high level, the clock signal CLK is at a low level, while the pulling-up node PU and the capacitor CAP are in a charging state, an output signal at the outputting terminal OUTPUT is at the low level;
when the input signal received by the inputting terminal INPUT is at the low level, CLKB is at the low level and CLK is at the high level, a potential at the node PU is pulled high, and thus the output signal at the outputting terminal OUTPUT is at the high level;

when the input signal received by the inputting terminal INPUT is at the low level, CLKB is at the high level and CLK is at the low level, a potential at the node PU is pulled low, and thus the output signal at the outputting terminal OUTPUT is at the low level;

the resetting terminal RESET is connected with an signal outputting terminal of a next stage shift register with respect to the current stage shift register;

the reference signal terminal VSS is used for inputting a low level signal to provide a reference voltage.

8. The gate driving circuit of claim 7, comprising:

a first thin film transistor, a gate and a drain thereof are connected with the signal inputting terminal INPUT, and a source thereof is connected with the pulling-up node PU;

a second thin film transistor, a gate thereof is connected with the resetting signal terminal RESET, a drain thereof is connected with the pulling-up node PU, and a source thereof is connected with the reference signal terminal VSS;

a third thin film transistor, a gate thereof is connected with the pulling-up node PU, a drain thereof is connected with the clock signal CLK, and a source thereof is connected with the signal outputting terminal OUTPUT;

a fourth thin film transistor, a gate thereof is connected with the resetting signal terminal RESET, a drain thereof is connected with the signal outputting terminal OUTPUT, and a source thereof is connected with the reference signal terminal VSS;

a fifth thin film transistor, a gate thereof is connected with a pulling-down connection node PD_CN, a drain thereof is connected with the first clock signal CLKB, and a source thereof is connected with a pulling-down node PD;

a sixth thin film transistor, a gate thereof is connected with the pulling-up node PU, a drain thereof is connected with the pulling-down node PD, and a source thereof is connected with the reference signal terminal VSS;

an eighth thin film transistor, a gate thereof is connected with the pulling-up node PU, a drain thereof is connected with the pulling-down connection node PD_CN, and a source thereof is connected with the reference signal terminal VSS;

a ninth thin film transistor, a gate and a drain thereof are connected with the first clock signal CLKB, and a source thereof is connected with the pulling-down connection node PD_CN;

a tenth thin film transistor, a gate thereof is connected with the pulling-down node PD, a drain thereof is connected with the pulling-up node PU, and the source thereof is connected with the reference signal terminal VSS;

an eleventh thin film transistor, a gate thereof is connected with the pulling-down node PD, a drain thereof is connected with the signal outputting terminal OUTPUT, and a source thereof is connected with the reference signal terminal VSS;

a twelfth thin film transistor, a gate thereof is connected with the first clock signal CLKB, a drain thereof is connected with the signal outputting terminal OUTPUT, a source thereof is connected with the reference signal terminal VSS;

a thirteenth thin film transistor, a gate thereof is connected with the first clock signal CLKB, a drain thereof is connected with the signal inputting terminal INPUT, and the source thereof is connected with the pulling-up node PU.

9. The gate driving circuit of claim 7, comprising:

a first thin film transistor, a gate and a drain thereof are connected with the signal inputting terminal INPUT, and a source thereof is connected with the pulling-up node PU;

a second thin film transistor, a gate thereof is connected with the resetting signal terminal RESET, a drain thereof is connected with the pulling-up node PU, and a source thereof is connected with the reference signal terminal VSS;

a third thin film transistor, a gate thereof is connected with the pulling-up node PU, a drain thereof is connected with the clock signal CLK, and a source thereof is connected with the signal outputting terminal OUTPUT;

a fourth thin film transistor, a gate thereof is connected with the resetting signal terminal RESET, a drain thereof is connected with the signal outputting terminal OUTPUT, and a source thereof is connected with the reference signal terminal VSS;

a fifth thin film transistor, a gate thereof is connected with a pulling-down connection node PD_CN, a drain thereof is connected with the first clock signal CLKB, and a source thereof is connected with a pulling-down node PD;

a sixth thin film transistor, a gate thereof is connected with the pulling-up node PU, a drain thereof is connected with the pulling-down node PD, and a source thereof is connected with the reference signal terminal VSS;

an eighth thin film transistor, a gate thereof is connected with the first clock signal CLKB, a drain thereof is connected with the pulling-down connection node PD_CN, and a source thereof is connected with the reference signal terminal VSS;

a ninth thin film transistor, a gate and a drain thereof are connected with the first clock signal CLKB, and a source thereof is connected with the pulling-down connection node PD_CN;

a tenth thin film transistor, a gate thereof is connected with the pulling-down node PD, a drain thereof is connected with the pulling-up node PU, and the source thereof is connected with the reference signal terminal VSS;

an eleventh thin film transistor, a gate thereof is connected with the pulling-down node PD, a drain thereof is connected with the signal outputting terminal OUTPUT, and a source thereof is connected with the reference signal terminal VSS;

a twelfth thin film transistor, a gate thereof is connected with the first clock signal CLKB, a drain thereof is connected with the signal outputting terminal OUTPUT, a source thereof is connected with the reference signal terminal VSS;

a thirteenth thin film transistor, a gate thereof is connected with the first clock signal CLKB, a drain thereof is connected with the signal inputting terminal INPUT, and the source thereof is connected with the pulling-up node PU;

a fourteenth thin film transistor, a gate thereof is connected with the first clock signal CLKB, a drain thereof is connected with the pulling-down node PD, and a source thereof is connected with the reference signal terminal VSS.

10. The gate driving circuit of claim 7, further comprising:

a first thin film transistor, a gate and a drain thereof are connected with the signal inputting terminal INPUT, and a source thereof is connected with the pulling-up node PU;

a second thin film transistor, a gate thereof is connected with the resetting signal terminal RESET, a drain thereof is connected with the pulling-up node PU, and a source thereof is connected with the reference signal terminal VSS;

a third thin film transistor, a gate thereof is connected with the pulling-up node PU, a drain thereof is connected with the clock signal CLK, and a source thereof is connected with the signal outputting terminal OUTPUT;

a fourth thin film transistor, a gate thereof is connected with the resetting signal terminal RESET, a drain thereof is connected with the signal outputting terminal OUTPUT, and a source thereof is connected with the reference signal terminal VSS;

a fifth thin film transistor, a gate and a drain thereof are connected with the first clock signal CLKB, and a source thereof is connected with the pulling-down node PD;

an eighth thin film transistor, a gate thereof is connected with a pulling-up node PU, a drain thereof is connected with the pulling-down node PD, and a source thereof is connected with the reference signal terminal VSS;

a ninth thin film transistor, a gate thereof is connected with the resetting signal terminal RESET, a drain thereof is connected with the first clock signal CLKB, and a source thereof is connected with the pulling-down node PD;

a tenth thin film transistor, a gate thereof is connected with the pulling-down node PD, a drain thereof is connected with the pulling-up node PU, and the source thereof is connected with the reference signal terminal VSS;

an eleventh thin film transistor, a gate thereof is connected with the pulling-down node PD, a drain thereof is connected with the signal outputting terminal OUTPUT, and a source thereof is connected with the reference signal terminal VSS.

11. An array substrate, wherein the array substrate comprises the gate driving circuit of claim 6.

12. A display apparatus, wherein the display apparatus comprise the array substrate of claim 11.

* * * * *